United States Patent
Kajiyama et al.

(10) Patent No.: US 9,513,563 B2
(45) Date of Patent: Dec. 6, 2016

(54) EXPOSURE HEAD AND EXPOSURE DEVICE

(71) Applicant: V TECHNOLOGY CO., LTD., Yokohama-Shi (JP)

(72) Inventors: Koichi Kajiyama, Yokohama (JP); Michinobu Mizumura, Yokohama (JP)

(73) Assignee: V TECHNOLOGY CO., LTD., Yokohama-Shi (JP)

(*) Notice: Subject to any disclaimer, the term of this patent is extended or adjusted under 35 U.S.C. 154(b) by 315 days.

(21) Appl. No.: 14/490,638

(22) Filed: Sep. 18, 2014

(65) Prior Publication Data

US 2015/0009478 A1    Jan. 8, 2015

Related U.S. Application Data

(63) Continuation of application No. PCT/JP2012/057024, filed on Mar. 19, 2012.

(51) Int. Cl.
*G03B 27/54* (2006.01)
*G03B 27/52* (2006.01)
*G03F 7/20* (2006.01)

(52) U.S. Cl.
CPC .......... *G03F 7/70191* (2013.01); *G03F 7/201* (2013.01); *G03F 7/2041* (2013.01); *G03F 7/70891* (2013.01)

(58) Field of Classification Search
CPC . G03F 7/70725; G03F 7/70191; G03F 7/201
USPC ............... 355/40–41, 67; 347/130
See application file for complete search history.

(56) References Cited

U.S. PATENT DOCUMENTS 4,524,372 A * 6/1985 De Cock ............ G06K 15/1247
250/208.1
6,396,565 B1 * 5/2002 Yamamoto ............. G03B 27/72
347/239
2012/0069430 A1 * 3/2012 Yamamura ........... G02B 3/0056
359/362

FOREIGN PATENT DOCUMENTS

CN     1753186 A    3/2006
JP     05-080524 A  4/1993
(Continued)

OTHER PUBLICATIONS

International Preliminary Report on Patentability (IPRP) dated Oct. 2, 2014, which issued in International Application No. PCT/JP2012/057024, and English language translation.
(Continued)

*Primary Examiner* — Hung Henry Nguyen
(74) *Attorney, Agent, or Firm* — McDermott Will & Emery LLP

(57) ABSTRACT

An exposure head according to the invention includes: a transparent substrate; a plurality of exposure light sources which is formed in the transparent substrate and emits exposure light; at least one condensing lens which condenses the exposure light from the exposure light sources on the exposure object; an imaging unit which is disposed on the opposite side to the condensing lens with the transparent substrate interposed therebetween and images the exposure object; and a control unit which controls the turning on of the exposure light sources based on image information imaged by the imaging unit. An exposure device according to the invention includes the exposure head according to the invention. By virtue of such a configuration, it is possible to improve alignment precision of the exposure object and to improve exposure precision of the exposure object.

16 Claims, 5 Drawing Sheets

(56) References Cited

FOREIGN PATENT DOCUMENTS

| | | |
|---|---|---|
| JP | 2000-289250 A | 10/2000 |
| JP | 2003-156853 A | 5/2003 |
| JP | 2003-163158 A | 6/2003 |
| JP | 2003-173029 A | 6/2003 |
| JP | 2007-079219 A | 3/2007 |
| JP | 2007-093646 A | 4/2007 |
| JP | 2007-093958 A | 4/2007 |

OTHER PUBLICATIONS

Chinese Office Action dated Aug. 31, 2015, which issued in Chinese Application No. 201280071476.3, and English language translation thereof.

* cited by examiner

EXPOSURE HEAD AND EXPOSURE DEVICE

CROSS-REFERENCE TO RELATED APPLICATION

This application is a continuation application of PCT/JP2012/057024, filed on Mar. 19, 2012.

BACKGROUND OF THE INVENTION

1. Field of the Invention

The present invention relates to an exposure head and an exposure device which expose an exposure object, and particularly, relates to an exposure head and an exposure device capable of improving exposure precision of an exposure object by improving alignment precision of the exposure object.

2. Description of Related Art

Hitherto, an exposure device which has: a light-emitting pixel array in which a plurality of light-emitting pixels that emits light is arranged into at least one line; a light-shielding mask which has apertures formed corresponding to the light-emitting pixels in such a manner that some light beams emitted from the light-emitting pixels pass the corresponding apertures and the entire region in each aperture is disposed to pass the light emitted from the corresponding light-emitting pixel, and that light incident to a region out of the aperture is blocked; a stage which holds an exposure object having a photosensitive film formed on a surface thereof; a condensing optical system which condenses light emitted from the light-emitting pixels and passing through the corresponding apertures of the light-shielding mask onto the exposure object held on the stage; and a moving mechanism which moves one of the exposure object held on the stage and the condensing optical system with respect to the other has been used (for example, see Japanese Patent Application Laid-open Publication No. 2007-079219).

In such an exposure device, a position of the exposure object is detected by imaging the exposure object using a CCD camera which is an imaging unit. When a positional deviation of the exposure object is detected, the exposure object is aligned by the moving mechanism.

However, in the conventional exposure device, the light-emitting pixel array which is an exposure light source and the CCD camera which is an imaging unit are separate components, and both of them are disposed separately from each other. In the exposure object, when a distance between an imaging portion which is imaged by the imaging unit and an exposure portion which is exposed by the exposure light source is large, a difference between the positional deviation in the imaging portion and the positional deviation in the exposure portion becomes large, and thus even when the exposure object is aligned based on the positional deviation of the imaging portion, there is a concern that sufficient alignment may not be conducted in the exposure portion. When the exposure portion is not sufficiently aligned, there is a concern that the exposure precision of the exposure object may be reduced.

SUMMARY OF THE INVENTION

Accordingly, an object to be achieved by the invention to deal with such problems is to provide an exposure head and an exposure device capable of improving exposure precision of an exposure object by improving alignment precision of the exposure object.

In order to achieve the object, an exposure head according to the invention includes: a transparent substrate; a plurality of exposure light sources which is formed in the transparent substrate and emits exposure light; at least one condensing lens which condenses the exposure light from the exposure light sources on the exposure object; an imaging unit which is disposed on the opposite side to the condensing lens with the transparent substrate interposed therebetween and images the exposure object; and a control unit which controls the turning on of the exposure light sources based on image information imaged by the imaging unit.

An exposure device according to the invention includes the exposure head according to the invention.

According to the exposure head of the invention, since the substrate in which the exposure light sources are formed is transparent, the imaging unit is capable of imaging the exposure object through this transparent substrate. Accordingly, the imaging unit can be disposed on the opposite side to the condensing lens with the transparent substrate interposed therebetween. That is, the imaging unit may be disposed near the exposure light sources, compared to a case in which the imaging unit and the exposure light sources are separate components and both of them are disposed separately from each other.

According to the exposure device of the invention, the distance between the imaging unit and the exposure light sources is small, and thus even when the exposure object is aligned based on the image information imaged by the imaging unit, alignment precision of the exposure object is rarely reduced. Accordingly, it is possible to improve exposure precision of the exposure object.

DESCRIPTION OF PREFERRED EMBODIMENTS

Figure 1:
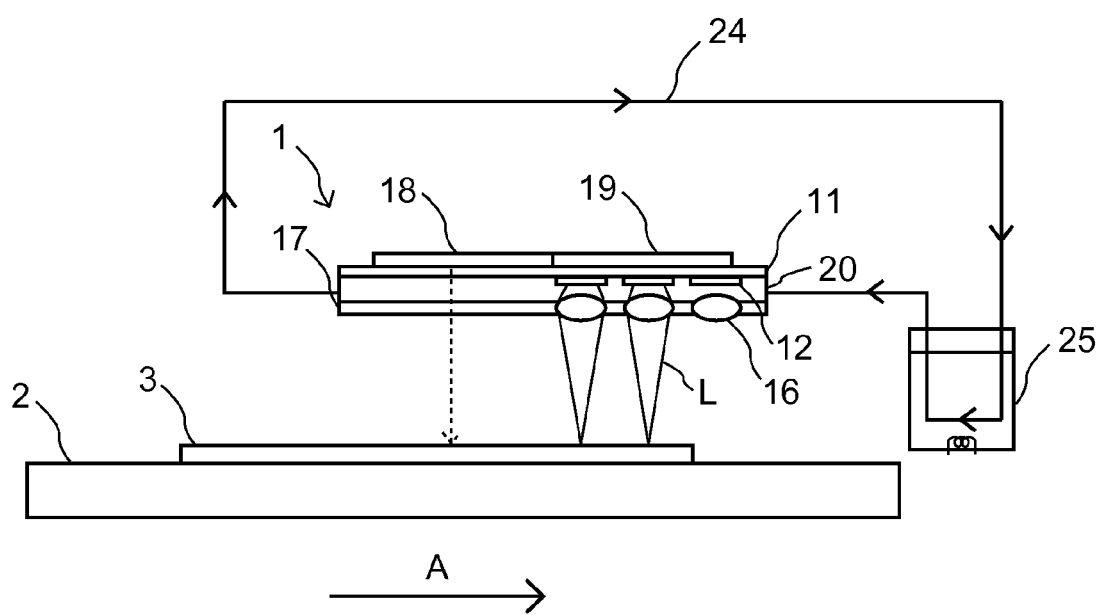
FIG. 1 is a side view illustrating an embodiment of an exposure device according to the invention.

Hereinafter, an embodiment of an exposure head according to the invention and an embodiment of an exposure device according to the invention having the exposure head mounted thereon will be described with reference to FIGS. 1 and 2.

This exposure device is capable of performing exposure without using a photomask while transporting an exposure target substrate 3 to be used in a liquid crystal display or the like in a certain transport direction (the direction of the arrow A in the drawings. Hereinafter, referred to as "transport direction A"). The exposure device includes an exposure head 1 and a transport stage 2. The exposure target substrate 3 is an exposure object of the invention.

As illustrated in FIG. 1, the exposure head 1 applies exposure light L to expose the exposure target substrate 3 placed on the transport stage 2. The exposure head 1 includes a transparent substrate 11, light-emitting diodes 12, condensing lenses 16, a cooling layer 20, an imaging unit 18, and a control unit 19.

The transparent substrate 11 is formed of a plate-like sapphire. The transparent substrate 11 is transparent with respect to light such as visible light and ultraviolet light so that the imaging unit 18 is capable of imaging the exposure target substrate 3 through the transparent substrate 11.

Figure 2:
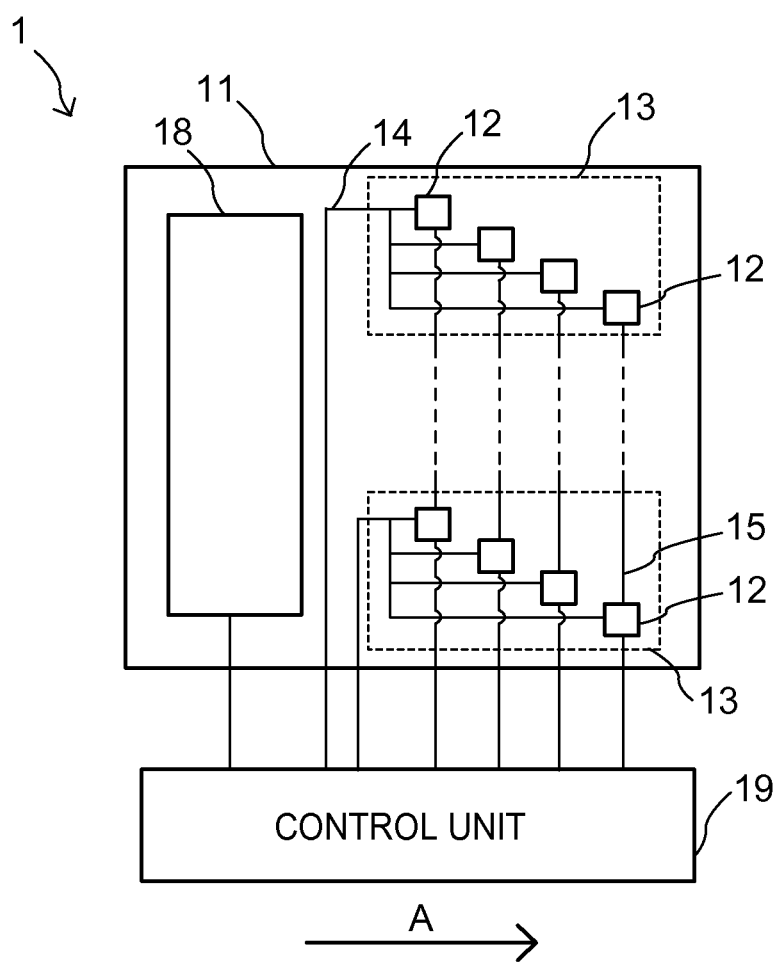
FIG. 2 is a block diagram illustrating an embodiment of an exposure head mounted on the exposure device.

As illustrated in FIG. 2, a plurality of light-emitting diodes (hereinafter, referred to as "LED") 12 is formed on the lower surface side (on the lower side of FIG. 1) of the transparent substrate 11. The LED 12 is an exposure light source of the exposure head 1 of the invention, and emits exposure light L to expose the exposure target substrate 3. More than one exposure unit 13, each of which is formed of a plurality of LEDs 12, is disposed on the lower surface side of the transparent substrate 11 in a direction perpendicular to the transport direction A. The exposure units 13 are formed of the plurality of LEDs 12 disposed on the straight line crossing the transport direction A at a predetermined angle.

The LEDs 12 disposed in an array are disposed to be able to expose the entire surface of an exposure target portion of the exposure target substrate 3. That is, the LEDs 12 are disposed so that a gap is not generated between two exposure regions on the exposure target substrate 3 exposed by two LEDs 12 next to each other, in other words, the above-described two exposure regions are in contact with each other or at least partially overlap each other.

Each of the LEDs 12 is connected to a source line 14 and a gate line 15. The turning on and off of each LED 12 is controlled through an active matrix system by inputting a control signal by the control unit 19 via the source line 14 and the gate line 15. Only one source line 14 is connected to each exposure unit 13, and this one source line 14 branches and is connected to a plurality of LEDs 12 forming the exposure unit 13. The gate line 15 is connected across a plurality of exposure units 13, and is disposed so as to connect the LEDs 12 forming each exposure unit 13 one by one.

The condensing lens 16 is disposed on one side of the transparent substrate 11 as illustrated in FIG. 1. The condensing lens 16 is a microlens disposed on an optical path of the exposure light L emitted from each LED 12, and condenses the exposure light L from the LED 12 on the surface of the exposure target substrate 3. More than one condensing lens 16 is formed in a lens substrate 17 disposed on one side of the transparent substrate 11, and form a microlens array. The transparent substrate 11 and the lens substrate 17 in which the condensing lenses 16 are formed are formed integrally with each other using a method such as bonding or pressure bonding, or by making the transparent substrate 11 and the lens substrate 17 as the same substrate.

The cooling layer 20 is formed between the transparent substrate 11 and the lens substrate 17 in which the condensing lenses 16 are disposed. The cooling layer 20 absorbs heat generated due to the turning on of the LEDs 12, prevents overheating of the exposure head 1, and includes a coolant. The coolant in the cooling layer 20 is circulated in a sealed coolant circuit 24 through a water-cooled tiller 25, and the tiller 25 adjusts a temperature of the coolant. As the coolant of the cooling layer 20, a liquid transmitting exposure light L from the LED 12 is selected. In particular, pure water or an antifreeze having an insulating property is preferably used as the coolant. For example, it is possible to use a FLUORINERT (registered trade name) of Sumitomo 3M Limited as an antifreeze having an insulating property.

The imaging unit 18 is disposed on the opposite side to the condensing lenses 16 with the transparent substrate 11 interposed therebetween. The imaging unit 18 which is, for example, a CCD camera or the like is fixed to the transparent substrate 11. The imaging unit 18 images the source lines 14 and the gate lines 15 formed in the exposure target substrate 3, an alignment mark, or the like through the transparent substrate 11. The imaged image information is input to the control unit 19.

In addition, the control unit 19 is disposed on the same side as the imaging unit 18 of the transparent substrate 11. The control unit 19 which is, for example, a driver IC controls the turning on and off of each of the plurality of LEDs 12 based on the image information imaged by the imaging unit 18. The control unit 19 is connected to an exposure device control unit (not illustrated) provided outside the exposure head 1, and a predetermined position of the exposure target substrate 3 in a case in which there is no positional deviation, and an exposure pattern to be subjected to exposure on the exposure target substrate 3 are input from the exposure device control unit. The exposure pattern of the exposure target substrate 3 is input as, for example, CAD information.

The transport stage 2 holds and transports the exposure target substrate 3, which is an exposure object of the exposure head 1, in the transport direction A as illustrated in FIG. 1. The transport stage 2 is installed on an install surface of the exposure device and the above-described exposure head 1 is disposed thereon. The exposure target substrate 3 is transported using a rail, a roller, a vacuum chuck, or the like. The exposure target substrate 3 is exposed when passing below the exposure head 1 while being transported by the transport stage 2.

Next, an operation of the exposure device configured as described above will be described with reference to FIGS. 3 and 4.

Figure 3:
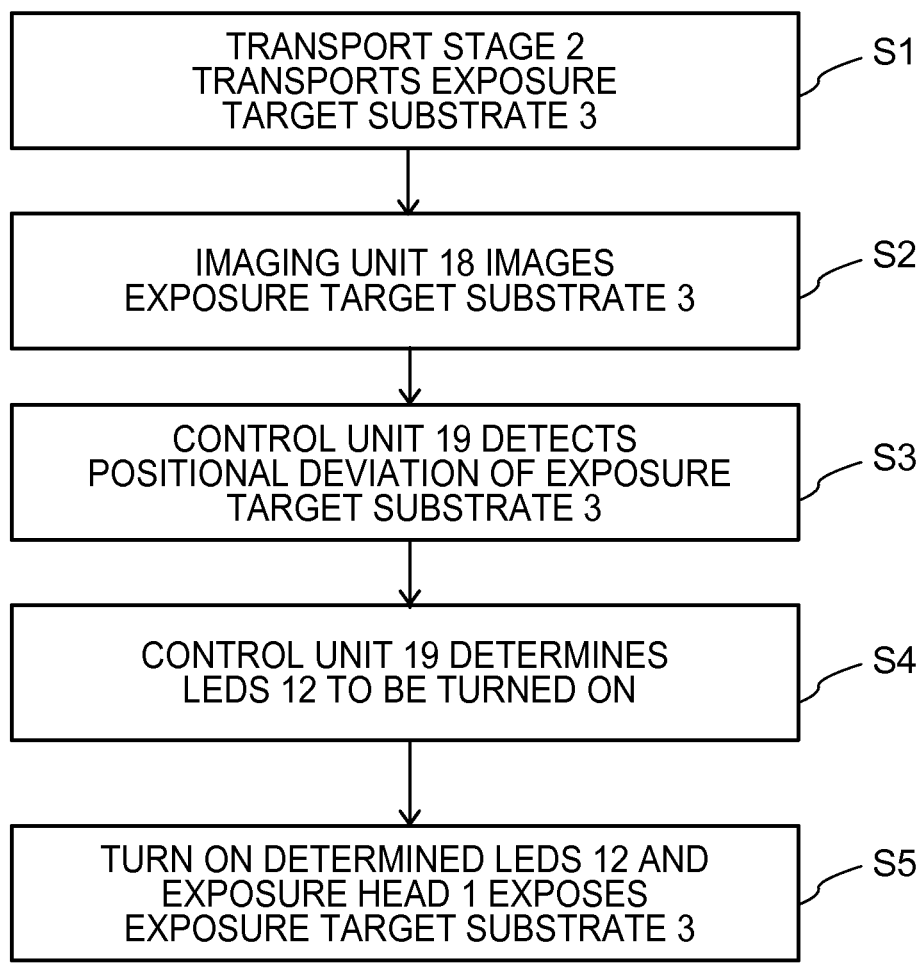
FIG. 3 is a flowchart illustrating an operation of the exposure device.

The transport stage 2 transports the exposure target substrate 3 in the transport direction A in Step S1 illustrated in FIG. 3. Arbitrary transport speed of the exposure target substrate 3 may be set.

The imaging unit 18 images the exposure target substrate 3 in Step S2. When the exposure target substrate 3 passes below the imaging unit 18, the imaging unit 18 images the source lines and the gate lines formed in the exposure target substrate 3, an alignment mark, or the like, and inputs the imaged image information to the control unit 19. The imaging by the imaging unit 18 is performed at arbitrary timing. For example, the imaging may be performed at predetermined time intervals, or at all times. The imaging may be controlled by the control unit 19.

In Step S3, the control unit 19 detects a positional deviation of the exposure target substrate 3 based on the image information imaged by the imaging unit 18. The control unit 19 compares a position of the exposure target substrate 3 detected from the image information imaged by the imaging unit with a predetermined position of the exposure target substrate 3 input in advance, to detect a positional deviation of the exposure target substrate 3 in the direction perpendicular to the transport direction A.

Figure 4:
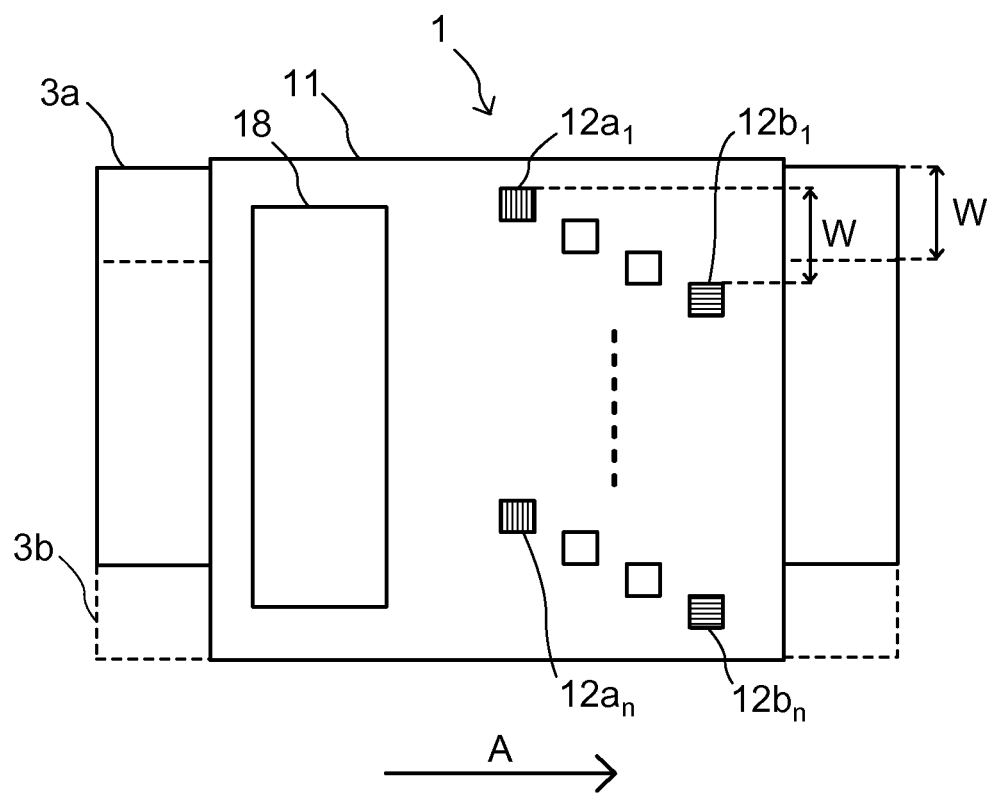
FIG. 4 is an explanatory view illustrating an exposure substrate to be exposed by the exposure device and LEDs to be turned on in response to a positional deviation of the exposure substrate.

In Step S4, the control unit 19 determines LEDs 12 to be turned on in response to the positional deviation of the exposure target substrate 3 detected in Step S3 and an exposure pattern of the exposure target substrate 3 input in advance. For example, as illustrated in FIG. 4, when it is detected that the exposure target substrate 3 is positioned in an exposure target substrate 3a which is a predetermined position input in advance (that is, when there is no positional deviation), the control unit 19 determines the turning on of, among the plurality of LEDs 12, a plurality of LEDs $12a_1$ to $12a_n$ in response to the exposure pattern of the exposure target substrate 3 input in advance. When it is detected that the exposure target substrate 3 is positioned in an exposure target substrate 3b deviated from the predetermined position input in advance by a deviation amount W in the direction perpendicular to the transport direction A (that is, when a positional deviation by the deviation amount W is detected), the control unit 19 determines the turning on of a plurality of LEDs $12b_1$ to $12b_n$ deviated by the deviation amount W from the plurality of LEDs $12a_1$ to $12a_n$. That is, the plurality of LEDs $12a_1$ to $12a_n$ and the plurality of LEDs $12b_1$ to $12b_n$ correspond to each other, and exposure patterns to be subjected to exposure by these plurality of LEDs 12 match. The control unit 19 inputs a control signal indicative of LEDs 12 to be turned on, a time to turn on or off, or the like, to the respective LEDs 12 via the source lines 14 and the gate lines 15. In FIG. 4, the source lines 14, the gate lines 15, and the control unit 19 are omitted.

The exposure head 1 exposes the exposure target substrate 3 in Step S5. The LEDs 12 emit exposure light L based on a control signal input from the control unit 19, and the condensing lens 16 condenses the emitted exposure light L on the exposure target substrate 3 to expose the exposure target substrate 3 with the condensed exposure light L.

According to this embodiment, the exposure head 1 includes: the transparent substrate 11; the plurality of LEDs 12 (exposure light source) which is formed in the transparent substrate 11 and emits exposure light L; the condensing lenses 16 which condense the exposure light L from the LEDs 12 on the exposure target substrate 3; the imaging unit 18 which is disposed on the opposite side to the condensing lenses 16 with the transparent substrate 11 interposed therebetween and images the exposure target substrate 3; and the control unit 19 which controls the turning on of the LEDs 12 based on the image information imaged by the imaging unit 18. By virtue of such a configuration, the imaging unit 18 may be disposed near the LEDs 12. Accordingly, in the exposure device having this exposure head 1 mounted thereon, the distance between the imaging unit 18 and the LEDs 12 is small, and thus even when the exposure target substrate 3 (exposure object) is aligned based on the image information imaged by the imaging unit 18, alignment precision of the exposure target substrate 3 is rarely reduced. Accordingly, it is possible to improve exposure precision of the exposure target substrate 3.

According to this embodiment, since the transparent substrate 11, the LEDs 12, the condensing lenses 16, and the imaging unit 18 are formed integrally with each other, no positional deviation occurs between the LEDs 12, the condensing lenses 16, and the imaging unit 18, and it is possible to improve exposure precision. In addition, it is possible to reduce the exposure head in size.

According to this embodiment, the control unit 19 detects a positional deviation of the exposure target substrate 3 based on the image information imaged by the imaging unit 18, and determines LED 12 to be turned on in response to this positional deviation. That is, even when the positional deviation of the exposure target substrate 3 is detected, it is possible to expose a correct position of the exposure target substrate 3 without physically moving the exposure target substrate 3, the LEDs 12 and the like. Accordingly, it is possible to improve exposure precision without the occurrence of vibrations associated with the above-described movement of the components or of a control error.

According to this embodiment, the exposure target substrate 3 is exposed by the LEDs 12 disposed in an array. Accordingly, it is possible to improve exposure precision by increasing the number of the LEDs 12 to be disposed by reducing the LEDs 12 in size.

According to this embodiment, since the transparent substrate 11 is formed of sapphire, it is possible to easily form the LEDs 12.

According to this embodiment, since the exposure head 1 is provided with the cooling layer 20 including a coolant between the transparent substrate 11 and the lens substrate 17 in which the condensing lenses 16 are disposed, it is possible to prevent overheating of the exposure head 1 by heat generated due to the turning on of the LEDs 12.

According to this embodiment, the cooling layer 20 may use an antifreeze as the coolant. Using the antifreeze, it is possible to prevent trouble which is caused by freezing of the coolant if a temperature at which the exposure head 1 is operated is equal to or higher than a solidifying point of the antifreeze.

In this embodiment, the exposure object is the exposure target substrate 3, but may be a film. In this case, the exposure device may be provided with, for example, a roller which sends the film and a roller which winds the film therearound, in place of the transport stage 2. The exposure device may be provided with one or more exposure heads 1 according to the invention.

In this embodiment, the transparent substrate 11 is formed of sapphire, but is not limited thereto so long as it is a transparent material so that the imaging unit 18 is capable of imaging the exposure object through the transparent substrate 11. For example, the transparent substrate 11 may be formed of zinc oxide (ZnO). The exposure light source is not limited to the LED 12, and may be a laser diode (LD) or an organic EL. One condensing lens 16 may be provided with respect to a plurality of LEDs 12. The imaging unit 18 may be disposed at any position on the transparent substrate 11 so long as it is capable of imaging the exposure object. However, the imaging unit 18 is preferably provided on the front side of the LEDs 12 in the transport direction A. The control unit 19 may be provided outside the exposure head 1. The control of the LEDs 12 by the control unit 19 is not limited to the active matrix system, and may be performed through, for example, a passive matrix system. The tiller 25 may be an air-cooled tiller.

Figure 5:
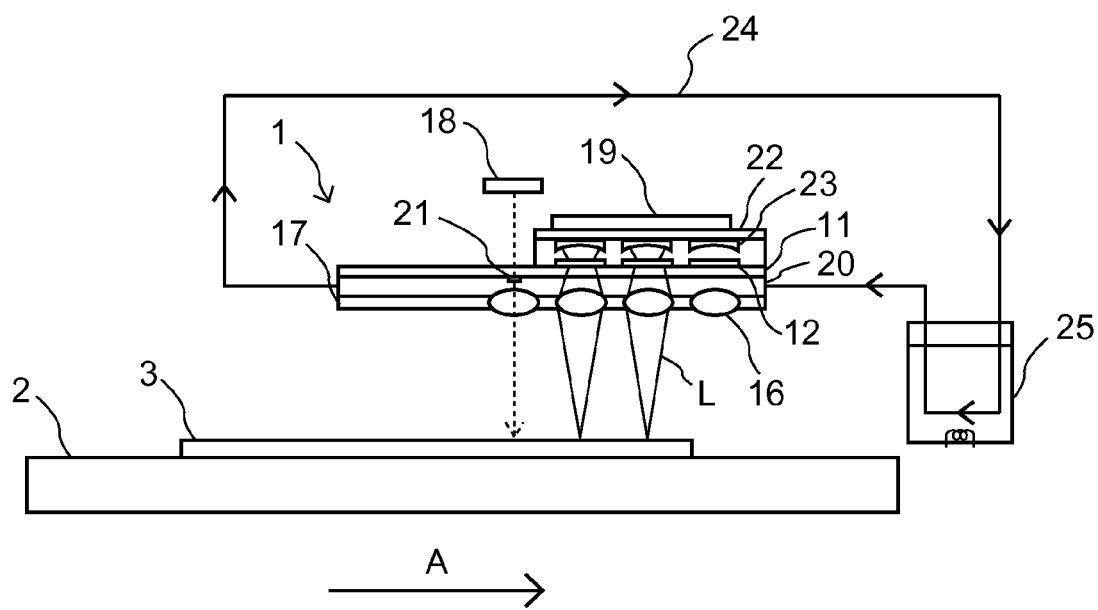
FIG. 5 is a side view illustrating another embodiment of the exposure device according to the invention.

Next, another embodiment of the exposure device and the exposure head according to the invention will be described with reference to FIG. 5. Here, different parts from the first embodiment will be described.

This exposure device includes an exposure head 1 and a transport stage 2, and the exposure head 1 includes a transparent substrate 11, light-emitting diodes 12, condensing lenses 16, a cooling layer 20, an imaging unit 18, a control unit 19, and micromirrors 23.

In this embodiment, the LEDs 12 are formed on the upper surface side (on the upper side of FIG. 5) of the transparent substrate 11, and the micromirrors 23 are disposed thereabove (that is, on the opposite side to the condensing lenses 16 with the transparent substrate 11 interposed therebetween).

The micromirrors 23 reflect exposure light L from the LEDs 12 toward the transparent substrate 11, and are respectively provided with respect to the plurality of LEDs 12. The micromirror 23 is preferably a concave mirror, and its mirror surface may be selected from a spherical surface, a parabolic surface, an elliptical surface, and the like. The micromirror 23 is disposed on the lower surface side of a mirror substrate 22, and the control unit 19 is provided on the upper surface side of the mirror substrate 22.

The imaging unit 18 is disposed separately from the transparent substrate 11 on the opposite side to the condensing lenses 16 with the transparent substrate 11 interposed therebetween. The imaging unit 18 simultaneously images an alignment mark 21 provided on the transparent substrate 11 and an exposure target substrate 3 via the condensing lenses 16, and the control unit 19 controls the turning on and off of the LEDs 12 based on the imaged image information. Accordingly, even when the imaging unit 18 and the transparent substrate 11 relatively deviate from each other in the exposure head 1, it is possible to improve alignment precision of the exposure target substrate 3.

According to this embodiment, the micromirrors 23 are disposed on the opposite side to the condensing lenses 16 with the transparent substrate 11 interposed therebetween, and reflect exposure light L from the LEDs 12 toward the transparent substrate 11. Accordingly, the exposure light L emitted toward the opposite side to the exposure target substrate 3 from the LEDs 12 can be used in the exposure of the exposure target substrate 3.

In this embodiment, the mirror substrate 22 is disposed so as not to block the space between the imaging unit 18 and the transparent substrate 11. However, the mirror substrate 22 may be formed of a material which is transparent with respect to visible light, and may be disposed to cover the entire surface on the upper surface side of the transparent substrate 11.

It should be understood that many modifications and variations of the described embodiment of the invention will be apparent to a person having an ordinary skill in the art without departing from the spirit and scope of the present invention as claimed in the appended claims.

What is claimed is:

1. An exposure head which exposes an exposure object, comprising:
    a transparent substrate;
    a plurality of exposure light sources which is formed in the transparent substrate and emits exposure light;
    at least one condensing lens which condenses the exposure light from the exposure light sources on the exposure object;
    an imaging unit which is disposed on the opposite side to the condensing lens with the transparent substrate interposed therebetween and images the exposure object; and
    a control unit which controls the turning on of the exposure light sources based on image information imaged by the imaging unit.

2. The exposure head according to claim 1,
wherein the transparent substrate, the exposure light sources, the condensing lens, and the imaging unit are formed integrally with each other.

3. The exposure head according to claim 1,
wherein the control unit detects a positional deviation of the exposure object based on the image information imaged by the imaging unit, and determines exposure light sources to be turned on in response to the positional deviation.

4. The exposure head according to claim 1,
wherein the exposure light sources include light-emitting diodes, laser diodes, or organic ELs, disposed in an array.

5. The exposure head according to claim 1,
wherein the transparent substrate is formed of sapphire.

6. The exposure head according to claim 1,
wherein a cooling layer including a coolant is provided between the transparent substrate and the condensing lens.

7. The exposure head according to claim 6,
wherein the cooling layer uses an antifreeze as the coolant.

8. The exposure head according to claim 1,
wherein mirrors are disposed on the opposite side to the condensing lens with the transparent substrate interposed therebetween and reflects the exposure light from the exposure light sources toward the transparent substrate.

9. An exposure device comprising:
the exposure head according to claim 1.
10. An exposure device comprising:
the exposure head according to claim 2.
11. An exposure device comprising:
the exposure head according to claim 3.
12. An exposure device comprising:
the exposure head according to claim 4.
13. An exposure device comprising:
the exposure head according to claim 5.
14. An exposure device comprising:
the exposure head according to claim 6.
15. An exposure device comprising:
the exposure head according to claim 7.
16. An exposure device comprising:
the exposure head according to claim 8.

* * * * *